United States Patent [19]

Bohlen et al.

[11] Patent Number: 4,591,540
[45] Date of Patent: May 27, 1986

[54] METHOD OF TRANSFERRING A PATTERN INTO A RADIATION-SENSITIVE LAYER

[75] Inventors: Harald Bohlen, Ammerbuch, Fed. Rep. of Germany; Erwin Bretscher, Rapperswil, Switzerland; Helmut Engelke, Altdorf; Peter Nehmiz, Stuttgart, both of Fed. Rep. of Germany; Peter Vettiger, Langnau, Switzerland; Johann Greschner, Pliezhausen, Fed. Rep. of Germany

[73] Assignee: International Business Machines Corporation, Armonk, N.Y.

[21] Appl. No.: 603,020

[22] Filed: Apr. 23, 1984

[30] Foreign Application Priority Data

May 23, 1983 [EP] European Pat. Off. ......... 83105177.6

[51] Int. Cl.⁴ .............. G03F 9/00; G03C 5/00
[52] U.S. Cl. ..................... 430/22; 430/296; 430/311; 430/394; 430/396
[58] Field of Search .......... 430/296, 5, 22, 394, 430/311, 396; 250/492.2

[56] References Cited

U.S. PATENT DOCUMENTS 3,615,466 10/1971 Sahni ........................ 430/5
4,426,584 1/1984 Bohlen et al. ............ 250/492.2
4,504,558 3/1985 Bohlen et al. ............ 430/30

Primary Examiner—John E. Kittle
Assistant Examiner—José G. Dees
Attorney, Agent, or Firm—Wolmar J. Stoffel

[57] ABSTRACT

According to this process two partial patterns which, if superimposed upon each other in a predetermined alignment relative to each other yield the desired pattern, with elements of both partial patterns combining to form elements of the pattern, and these partial pattern elements overlapping sectionally, are projected with a suitable radiation onto the radiation-sensitive layers. Overlapping is achieved in that when designing the two partial patterns a pattern corresponding to the desired pattern is used as a basis in that the elements of this pattern are exposed to a negative windage, the negative windage pattern is subsequently partitioned into two negative windage patterns corresponding to the partial patterns, and finally the negative windage partial pattern elements are exposed to a positive windage to the desired size of the partial pattern elements.

The method is used in particular when a pattern is to be transferred by means of hole masks, and if it is necessary, e.g. because the pattern shows annular elements, to use instead of one mask only two complementary masks each comprising at least one part of the pattern.

11 Claims, 11 Drawing Figures

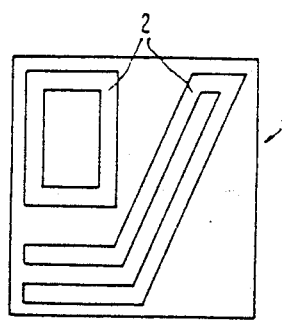
FIG.1
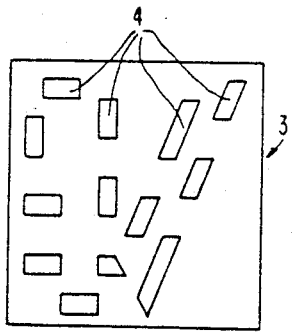
FIG.2
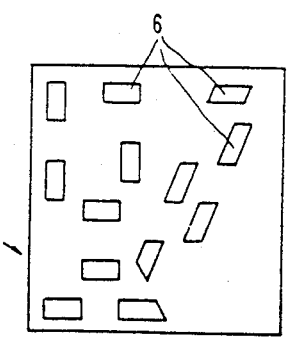
FIG.3
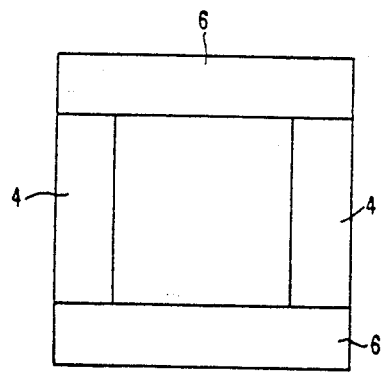
FIG.4
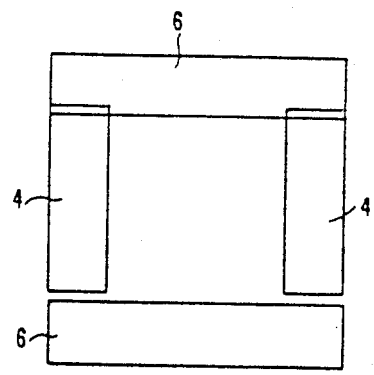
FIG.5
FIG.7
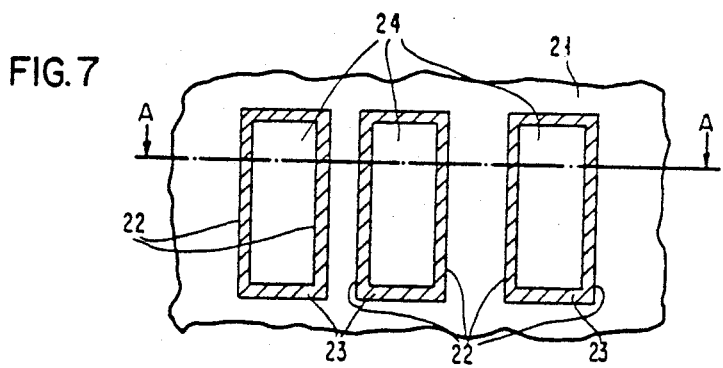
FIG.8
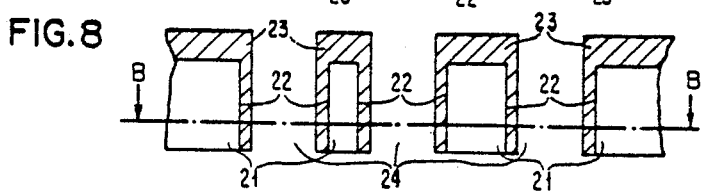

METHOD OF TRANSFERRING A PATTERN INTO A RADIATION-SENSITIVE LAYER

TECHNICAL FIELD

The invention relates to a method of transferring a pattern into a radiation-sensitive layer on substrates, where two partial patterns—which represent the pattern if superimposed upon each other and aligned in a predetermined manner, with elements of the two partial patterns joining to form elements of the pattern, and with these partial pattern elements sectionally over-lapping—are projected with a suitable radiation on the radiation-sensitive layer, aligned in a predetermined manner relative to each other and to the substrates. The pattern is thus produced latently in the radiation-sensitive layer, which is then developed. The term elements refers to individual separate sections of the patterns.

For transferring patterns in radiation-sensitive layers, masks are used e.g. in semiconductor technology, particularly if one and the same pattern is to be transferred a considerable number of times. If patterns are transferred for only a few rather than for a great number of times it may be economical not to start the process with making the mask, but to transfer the pattern directly onto the substrate by means of a controlled focussed electron beam. There exist two main types of masks. In one type, the pattern is etched in a thin layer which is applied on a glass plate serving as substrate, and consists of a gelatin emulsion or of a metal, as e.g. chromium. In the other mask type, the substrate consisting e.g. of a silicon wafer has through-holes which correspond to the mask pattern. In the production of both mask types the pattern—usually strongly scaled down—is transferred into a radiation-sensitive layer on the mask substrate by means of selective irradiation and subsequent development. The masks with a layer consisting of a gelatin emulsion are then ready for use (emulsion masks), while in those cases where the finished mask pattern is etched into a metal layer or into the mask substrate, the pattern in the radiation-sensitive layer is used as an etching mask during the etching of the metal layer or of the mask substrate. The selective irradiation of the radiation-sensitive layer is effected either in that the layer is irradiated through a master mask with the pattern, or in that it is selectively imprinted e.g. by means of a focussed electron beam in accordance with the respective mask pattern. Usually, the master mask, too, is produced by means of selective irradiation with a focussed electron beam. The instructions for controlling the focussed electron beam are generated in that, first, the mask pattern is designed in a program-controlled mode by means of graphic screen connected to a computer, and, second, it is stored in the storage system of the computer. By means of an arithmetic unit, the existing mask patterns are then converted into the control instructions for the electron beam in the above specified manner.

In semiconductor technology, the masks are used e.g. for selectively covering the semiconductor wafers for the doping with conductivity-determining impurities, for etching in passivating layers on the semiconductor wafer openings for contacting regions of the semiconductor material, and for producing conductive networks out of a blanket-applied metal layer, e.g. to interconnect semiconductor regions.

In the course of the growing tendency toward microminiaturization and maximum integration for integrated circuits, the respective mask patterns to be transferred are getting more and more complicated. Consequently, the production of the masks required becomes increasingly complicated and complex, too. The mask production is a considerable cost factor in the production of integrated circuits. Methods permitting reduced efforts for mask production are therefore of considerable interest. Such a method is described in the article "Method of Art Work Generation" published in IBM Technical Disclosure Bulletin, Vol. 21, No. 5, October 1978, pp. 1926 and 1927. It is important to know in that connection that for the production of electronic computer systems many chips with integrated circuits are required which differ from each other and are in some cases required in small numbers only. It would be exceptionally expensive to process each type of circuit individually, and to design for each type an individual set of masks. Consequently, all circuits are processed together up to a quite advanced stage of production, i.e. up to the generation of the conductive networks, and the individual integrated circuits are generated only then, using specific wiring masks. However, the production and in particular the design of the specific wiring masks is still rather complex. Since the individual wiring masks required frequently differ to a very small degree only, it is suggested in the above mentioned article to use two respective masks for the transfer of the conductive pattern, one mask containing the pattern elements common to all interconnection patterns and therefore applicable to each circuit type, and the second mask containing only those pattern elements that differ in the various wiring networks, the second mask being usually very uncomplicated owing to the small differences between the various patterns. By a corresponding adjustment of the two masks relative to each other it is made sure, when irradiating the substrate first through one mask and then through the other, that the entire conductive pattern is transferred onto the substrate in its respective specific design. This considerably cuts down expenses of the masks for transferring different conductive patterns. However, it is difficult to avoid errors in the alignment of one mask over the other, and it is thus practically inevitable that in the overall pattern transferred onto the substrate there is overlapping and/or separation of pattern elements in those places where according to the circuit design such elements should be flush with each other. If the pattern elements are separated from each other this is intolerable in any event because this would mean an undesired interruption of a conductive line in the finished circuit. An excessive overlapping is not acceptable, either, because double exposure connected with overlapping—at any rate if the irradiation involved is an electron irradiation—causes a widening ("blooming") of a conductive line in the finished circuit pattern which considering the high packing density of highly integrated circuits could cause a short circuit. Minor overlapping however was found not to cause such a widening of the conductors, and the authors of the above mentioned article therefore suggest, in order to compensate small adjustment defects to design the masks in such a manner, that with a optimum alignment of the two masks relative to each other the projections of the complementary pattern elements are not provided in flush arrangement, but overlap slightly. This intentional overlapping is such that in case of adjustment errors within the manufacturing tolerances a too large overlap, on the one hand, which would cause a short circuit, and on the other a separation of corresponding pattern elements interrupting a conductor are avoided.

If the connection pattern is directly transferred with a focussed, computer-controlled electron beam the partitioning into two partial patterns is economical, too, provided the respective connecting patterns differ only slightly, for making the pattern, which is the most complex part of mask production, has to be implemented also in the generation of the control instructions for the electron beam. However, transferring two partial patterns by means of electron beams also involves adjustment errors, and the problems connected therewith.

Masks that consist of a substrate with through-holes corresponding to the mask pattern cannot contain any ring-shaped holes since the substrate material within the ring would not have any connection to the rest of the substrate. Such a mask should not comprise any hole elements, either which limit stripe-shaped substrate material areas since such areas are mechanically unstable. In order to be able in spite of this fact to transfer with hole masks annular and tongue-enclosing pattern elements onto a substrate a method has been developed which is described in DAS No. 27 39 502. According to this method, the pattern to be transferred is partitioned into two partial patterns which comprise neither annular elements nor elements enclosing tongue-shaped areas, but which if superimposed upon each other can combine to form such pattern elements. If a radiation-sensitive layer is successively irradiated through two masks each comprising one of the partial patterns as a mask pattern the pattern can be transferred into the radiation-sensitive layer, provided the two masks are exactly aligned relative to each other. It would be obvious to implement partitioning into two partial patterns in such a manner that apart from portions with annular and tongue-enclosing hole elements the one partial pattern coincides with the pattern, and the other merely comprises the necessary supplementary pattern in the above portions. Partitioning into two partial patterns would be relatively easy in that case. Unfortunately, such partitioning is problematic, for the following reasons: electron irradiation raises the temperature of the mask, and inevitably causes a certain distortion of the mask pattern. This distortion is not critical as it can be considered when designing the pattern. If two masks are used for transferring the pattern both masks must be distorted alike. For that purpose however, the ratio in both masks of hole surfaces to substrate surfaces has to be approximately equal, and the hole distribution over the substrate and the size of the holes in both masks must be approximately the same. It is only under these conditions that the heat quantity absorbed by the radiation, and the derived heat quantity and consequently the respective distortion of the two masks are the same. Any partitioning into the two partial patterns taking into consideration the above conditions would be rather complex if implemented with drawings. However, if the mask pattern is converted in the above specified manner into control instructions for a focussed electron beam, partitioning can be implemented in a program-controlled mode under the above mentioned conditions, in that stage where the pattern is stored as a computer program.

The problems specified above in the example of the emulsion or chromium masks, which can be encountered if during irradiation the second mask is not optimally aligned to the first one can also appear if two hole masks are used for irradiation. The above described method of providing overlap areas when making partial patterns where corresponding pattern elements are adjacent each other, should therefore be used, too, when transferring patterns by means of hole masks. If, as in the above example in connection with emulsion or chromium masks respectively, the two partial patterns comprise only few pattern elements combining into elements of the pattern, it is relatively uncomplicated to include the overlap regions in the mask design. However, if there is a great number of places where elements of the partial patterns combine into elements of the pattern—e.g. if partitioning has to be implemented in accordance with the above mentioned conditions—the supplementary introduction of overlap regions, irrespective of whether this inclusion is to be effected by drawings or in a program-controlled mode, is very complex, and/or comprises the considerable risk of errors occurring.

DISCLOSURE OF INVENTION

It is the object of the invention to provide a method of transferring a pattern into radiation-sensitive layers, where two partial patterns which represent the pattern if superimposed upon each other in a corresponding alignment, and which partly overlap, are projected onto the layers, this process being uncomplicated in its execution, and the risk of errors in the design of the partial patterns being very low.

The defined overlapping is achieved with the method as disclosed by the invention because the negative and positive windage shifts the contours of the individual pattern elements, or of the partial patterns, respectively, to the inside or outside, respectively and because that part of the contours which appears only upon the cutting of a pattern element participates only in the positive but not in the negative windage.

According to the method as disclosed by the invention, and provided the dimension changes in connection with negative and positive windage have been correctly selected, there are no undesired gaps between combinatory elements of the partial patterns, nor any such overlaps of partial pattern elements that widenings (bloomings) are forming in the overlap regions, even if upon the projection of the two partial patterns onto the radiation-sensitive layers the respective positioning errors have reached a maximum i.e. if they are just within the admissible tolerance.

The method according to the invention can be advantageously applied in those cases where a pattern to be transferred onto a substrate must be or can be partitioned into two partial patterns, and be subsequently assembled again by projecting the two partial patterns one over the other. Consequently, the method as disclosed by the invention is applicable not only if, as in the above mentioned article published in the IBM Technical Disclosure Bulletin, the efforts in connection with the production of emulsion or chromium masks, or of instructions for controlling focussed beams for the making of a multitude of only slightly different metallization patterns are to be reduced, but also if patterns are to be transferred by means of hole masks, and if the pattern, if it is not partitioned, comprises elements for whose transfer annular hole elements in the mask substrate would be required, or hole elements enclosing elongated, tongue-shaped mask substrate regions.

Negative windage, partitioning, and positive windage of the pattern elements can be implemented either by means of drawings, or in a particularly advantageous mode by means of program control.

The program controlled transfer of a pattern can be advantageously executed in such a manner that the pattern is successively designed on the graphic screen by program control and on a computer-assisted basis, stored in a machine-readable form in the storage of a computer, that furthermore the stored pattern is subjected to a negative, program-controlled windage, partitioned into partial patterns which are then subjected to a positive windage to the required scale, that the thus obtained stored partial patterns are converted in a post processor into instructions to control an electron beam, the two partial patterns being latently transferred respectively into radiation-sensitive emulsion layers, or into a radiation-sensitive layer deposited on metal layers or on semiconductor substrates, that the transferred partial patterns are developed, the metal layers or semiconductor substrates, respectively, are etched using the developed, radiation-sensitive layer as an etching mask, and that the thus obtained mask patterns are projected successively and aligned relative to each other in a precisely defined manner, onto a radiation-sensitive layer which covers a substrate and onto which the pattern is to be transferred.

If following the method as disclosed by the invention hole masks are made, i.e. masks which consist of a semiconductor substrate containing the mask pattern in the form of through-holes, there arises the problem that the manufacturing tolerances cannot be optionally small, and that consequently the hole dimensions are either bigger or smaller than the nominal value. Since the two masks each representing one of the two partial patterns are usually provided on one semiconductor substrate directly adjacent to each other, both masks deviate from the nominal value in precisely the same manner. This problem can be advantageously avoided if when designing a mask the pattern elements to be later incorporated in the mask are made so big that they are bigger by the maximum manufacturing tolerance of the hole production than necessary, if after the making the holes the actual deviation from the nominal value is determined, and if finally the desired hole size is achieved by depositing material on the hole walls. So the operating mode of the above described method is that the holes made by etching are at least as big as it corresponds to their nominal value. If a measuring process reveals that the nominal value has been reached, no further steps are necessary, the mask is finished. However, if it is found that the holes are still too big, they can be made smaller in a defined manner by means of cathode sputtering or evaporation onto the substrate, and the nominal value can be reached. This variation of the method as disclosed by the invention is based on the knowledge that if material is applied on a substrate by evaporation, with the substrate, firstly, rotating round an axis vertically to its surface, and, secondly, being suspended in the evaporation chamber in such a manner that the steam jet is obliquely directed onto its surface, or by cathode sputtering, this material is grown not only on the surface of the substrate, but also, and with a defined speed, on the hole walls. It is obvious that this variation of the method as disclosed by the invention can only be applied if the dimensions of the holes after etching either equal the nominal value, or exceed it. As a material for reducing the hole size, a high heat conductivity material e.g. gold is preferably used, because this offers the additional advantage that the heat applied by the impinging radiation is rapidly dissipated, thus preventing an excessive heating and consequently excessive deformation of the mask during irradiation.

BRIEF DESCRIPTION OF DRAWINGS

Other advantageous embodiments of the method as disclosed by the invention are specified in the subclaims. The method according to the invention will be described below with reference to embodiments illustrated by drawings which represent the following:

FIG. 1 is a section of mask pattern comprising an annular mask element, and another mask element enclosing an elongated, tongue-shaped area of the mask material.

FIGS. 2 and 3 two partial patterns whose projection onto a substrate, provided they are precisely aligned relative to each other, presents the mask pattern of FIG. 1.

FIG. 4 is the projection of two partial patterns onto a substrate which combine to form an annular pattern element, and which are optimally aligned relative to each other.

FIG. 5 is a projection of the partial patterns of FIG. 4 which however, are not optimally aligned relative to each other so that they show overlaps and interruptions.

FIG. 7 is a sectional view through a hole mask (in plane B of FIG. 8, in parallel to the mask surface) where the nominal size of the holes has been produced by supplementary growing of material on the walls of the etched holes, and FIG. 8 is the sectional view through the hole mask of FIG. 7 (along plane B of FIG. 7, vertically to the mask surface).

BEST MODE FOR CARRYING OUT THE INVENTION

Figure 6A:
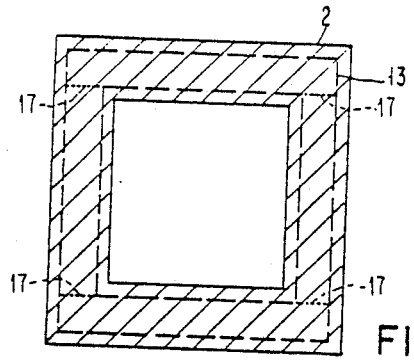
FIGS. 6A through 6C are the generation of two partial patterns out of one pattern in accordance with the method as disclosed by the invention.

The cases where the partitioning of a pattern to be transferred onto a substrate is advisable or necessary have already been discussed in the introduction. The necessity of partitioning in the second case, where the pattern is transferred by means of hole masks, i.e. by means of masks where the pattern exists in the form of through-holes in a substrate, and the advisable form of partitioning will be specified below with reference to FIGS. 1 to 3. FIG. 1 depicts a section of a pattern 1 which comprises an annular pattern element 2 and a pattern element which encloses an elongated, tongue-shaped area. Obviously, it is impossible that there is such an annular pattern element in the form of a through-hole in the substrate, because the framed substrate material does not have any connection with the rest of the substrate, and would therefore drop out of it. Although the other pattern element of FIG. 1 could exist as a through-hole in the mask, the elongated, tongue-shaped substrate area framed by that hole would be of a very poor mechanical stability. The above difficulties can be avoided if the mask pattern is partitioned into two complementary partial patterns. A satisfactory partition has to meet conditions which are valid with regard to the possible production and future use of the mask in irradiation equipment. This refers in particular to thin film masks in a silicon substrate which comprise pattern elements in the μm and in the sub-μm range, and which are to be irradiated with electron beams, X-rays or ion beams. The main aim is optimum fidelity of pattern transfer onto the substrate when the two partial patterns are projected successively thereon. So the basic conditions to be met by the masks are capability of being produced, mechanical stability and high heat conductivity in the mask plane. The two masks must furthermore be of the same nature with regard to their mechanical and thermal characteristics. The following set of rules permits the realization of the above specified aims in an economical and relatively uncomplicated manner:

1. Distribute the partial pattern elements in an approximately uniform density over both complementary masks.
2. Base partitioning of pattern on cutting of individual pattern elements.
3. Cut all occurring inside corners to avoid mechanical instabilities or drop outs of inside areas.
4. Cut large elements into pieces of a predetermined maximum length.
5. Give rule 3 priority over 4 if conflict arises with 7.
6. Avoid non-manufacturable narrow shapes.
7. Avoid checkerboard partitioning of pattern elements.

A more detailed specification of the partitioning for making complementary hole masks is given in IBM Technical Report 28.120, published by German Manufacturing Technology Center of IBM Deutschland GmbH, Sindelfingen, Germany. Partial patterns 4 and 6 depicted in FIGS. 2 and 3 have been made following the above rules, by partitioning pattern 1 of FIG. 1.

FIG. 4 depicts the projection onto a substrate of two partial pattern elements 4 and 6 of optimum alignment relative to each other. Partial pattern elements 4 and 6 are combined to form an annular pattern element, with the partial pattern elements at the predetermined contact lines neither overlapping, nor separating from each other but being provided in flush arrangement. FIG. 5 depicts the projection of the partial pattern elements 4 and 6 of FIG. 4 onto a substrate, without the two partial pattern elements 4 and 6 being provided in optimum arrangement relative to each other. Consequently, there are either overlaps of the two partial pattern elements at the predetermined lines of contact, or interruptions between them. It has been found that an overlap, i.e. a double exposure of the radiation-sensitive layer on the substrate to which the pattern is to be transferred is not critical if it does not exceed predetermined values depending on the radiation energy. However, an interruption between the two partial patterns, i.e. an unexposed strip existing in an area of the radiation-sensitive layer on the substrate which is to be completely exposed cannot be tolerated. If partial pattern elements 4 (FIGS. 4 and 5) would be longer by an amount which equals the width of the interruption of FIG. 5 there would be no interruption. However, such an extension could cause overlaps twice as wide as the interruption of FIG. 5. As specified above, an overwide overlap cannot be tolerated, either. Under standard manufacturing conditions, and with modern irradiation machines being used the overlap area, to compensate the maximum alignment errors, must have only a width (equalling approximately twice the alignment error) being so small (0.2 μm) that if there is an electron beam irradiation with an energy of 10 keV there is no "blooming" yet. "Blooming" appears in connection with double exposure with electron beams. The reason is the scattering or back-scattering to which the electrons are subjected when impinging on the radiation-sensitive layer covering the substrate, or on the substrate itself. Thus, part of the radiation is "scattered" to adjacent regions that have not been exposed. The range of the scattering depends on the primary electron energy and decreases with lower energy. With an electron energy of approximately 10 keV, "blooming" is still negligible with a 0.2 μm wide overlap region even for 0.5 μm wide conductors and a corresponding distance between the conductors. If electron beams are used, a minor alignment error which in connection with a sharply focussed image would cause a gap between combinatory pattern elements can still be tolerated, owing to the scattering effect of the electrons and the consequent blurring of the image. The situation is basically different if exposure takes place by means of X-rays or ion beams. Owing to the negligible scattering of ions the mask pattern is imaged much more precisely than if electrons are used (on the other hand, there is practically no blooming in connection with double exposure so that the fixing of overlap region is not critical for masks used in X-ray and ion irradiation). If there are no overlap regions each not entirely precise alignment therefore causes intolerable gaps between combinatory elements of the partial patterns. Since alignment errors cannot be excluded any measures as e.g. the method disclosed by the invention, for making masks to be used in X-ray or ion beam processes are indispensable. For masks for electron beam processes they are at any rate of advantage since they are less strict about the tolerance in the alignment of the thus made masks which can thus be used more economically.

Figure 6B:
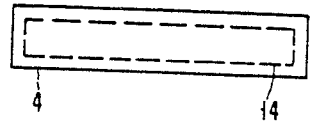
Figure 6B:
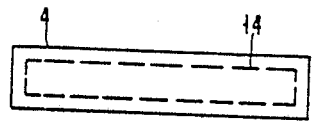
Figure 6C:
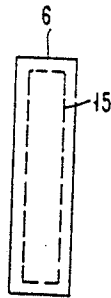

In the following, the method as disclosed by the invention will be discussed with reference to FIGS. 6A to 6C.

First, the respective pattern is designed, either by drawing means, e.g. on a drawing board, or in a program-controlled mode on a graphic screen using a repertoire of graphical elements. FIG. 6A depicts as an example an annular pattern element 2 (through-going lines) which is to be part of the respective pattern. Pattern element 2 is part of a pattern comprising a plurality of differently shaped pattern elements. All operations which will be described below with reference to the pattern elements of FIGS. 6A to 6C are executed accordingly with all elements of the pattern. The pattern designed is to be used in particular in the production of integrated circuits, i.e. the pattern finally transferred into a radiation-sensitive layer deposited on a substrate, e.g. a semiconductor substrate, is reduced by a very great factor relative to the designed pattern. If the pattern is designed on a graphic screen it is subsequently stored in machine-readable form in the storage of a computer.

For partitioning the designed pattern into two partial patterns which when projected one over the other again represent the respective pattern, and whose projection comprises overlaps, the pattern is subjected to various operations. In the following, the computer-controlled executing of these operations will be described. It is pointed out however that although the computer controlled method is particularly advantageous these operations can easily be executed by means of drawings, e.g. on the drawing board.

First, pattern element 2 is exposed to a negative windage under program control, said windage being performed perpendicularly to the contour lines. This operation results in pattern element 13 (dashed line) of FIG. 6A.

The negative windage and the below described positive windage of patterns are examples for geometric pattern manipulations. Such manipulations are frequently used for checking circuit designs for the observing of predetermined design rules, e.g. the minimum spacing between the pattern elements. Condition for geometrical manipulations by means of computers is the representation of the pattern elements in the form of polygons defined by a series of nodal coordinates. The edges of the polygon are suitably shifted by means of the computer. By forming points of intersection new nodal coordinates are determined which define the pattern elements exposed to negative or positive windage.

Figure 6D:
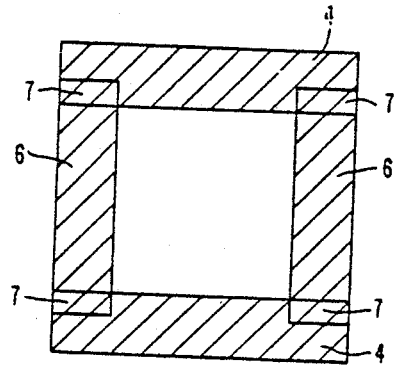
FIG. 6D is the projection of the (positive windage) partial patterns of FIGS. 6B and 6C onto a substrate with optimum alignment relative to each other.

In the next process step, pattern element 13 is partitioned, again under program control following the above specified rules. Details of the computer-controlled partitioning are given in the above mentioned Technical Report 28.120. In this partitioning process, pattern element 13 is cut into partial pattern elements 14 and 15 (dashed line) shown in FIGS. 6B and 6C by making the partitions along lines 17 (dotted). Partitioning along lines 17 is realized in accordance with the above mentioned rule 3 according to which partitioning is to be affected with inside corners being avoided. In the next process step—again by means of a program containing the corresponding algorithms—partial pattern elements 14 and 15 are subjected to a positive windage by shifting the contour lines perpendicularly thereto. This results in partial pattern elements 4 and 6 (through-going line) in FIGS. 6B and 6C. At that stage of the proceedings, the computer storage contains the two partial patterns whose projection, upon exact alignment, provides a pattern which—apart from a possible alteration of the scale—exactly corresponds to the original pattern. A comparison between FIGS. 6A and 6D clearly demonstrates this result. FIG. 6D depicts the projection of partial pattern elements 4 and 6 when exactly aligned relative to each other. Since the negative and positive windage in the example of FIGS. 6A to 6C is effected by the same amount, the shaded area framed by the through-going lines in FIG. 6A precisely corresponds to the shaded area depicted in FIG. 6D. In the projection however partial pattern elements 6 are not flush with partial pattern elements 4; in fact, the projection comprises overlap areas 7.

These overlap areas with the above specified positive effect are caused in that those parts of the contour lines of the partial pattern elements which are made by partitioning only take part in the positive but not in the negative windage. Therefore dimensions are changed in those parts where partial pattern elements 6 and 4 contact each other. The consequence are overlap areas 7 in the projection of the two partial patterns upon each other.

At that stage of the procedure, the two partial patterns are available either, if the partitioning and positive and negative windage have been performed by means of drawings on a drawing board, in the form of a plan on paper, or in the storage of the computer if the method has been applied in accordance with the above description. No further reference will be made in the following on how the plan on paper will be used for making masks, and for transferring the pattern by means of the masks onto a substrate. This method is well known in all its details. Furthermore, it has most probably been replaced almost completely by another method specified in detail below from which it does not basically differ. In fact, both processes have many steps in common.

The partial patterns of positive windage stored in the computer storage are converted by means of a post processor into instructions for controlling a focussed beam preferably consisting of electrons. By means of this controlled beam, the two partial patterns can be directly transferred into a radiation-sensitive layer covering the substrate, i.e. without "genuine" masks being used; in that case the "masks" are represented by the control instructions. The pattern transferred onto the substrate is usually strongly reduced in scale relative to the originally designed pattern.

If the pattern is to be transferred onto substrates a great number of times, the direct write-in with the electron beam is usually too costly, and the electron beam is then used merely for generating masks, i.e. emulsion, metal, or hole masks by means of which the pattern is finally transferred onto the substrates.

In emulsion and metal masks, the mask material is arranged on a supporting glass plate. The production of an emulsion mask is based on a radiation-sensitive layer which is applied on the glass substrate, and which is selectively irradiated with the respective pattern, and subsequently developed. The completed mask is now available. For making a metal mask, with chromium being preferably used as a metal one of two alternatives is selected. The first is based on a metal-coated glass plate, and a radiation-sensitive, e.g. positive resist is applied on the metal layer, the resist is irradiated by means of the focussed beam in accordance with the negative of the respective pattern, then developed, and finally the metal not covered by the resist is etched off. This method is called the subtractive method. The other alternative is based on an uncoated glass plate. This glass plate is coated with an e.g. positive radiation-sensitive resist, the resist is irradiated by means of the focussed beam in accordance with the respective pattern, then developed, a metal layer is evaporated on the developed resist layer and the bared substrate regions, and the remaining resist and the metal thereon are removed by means of a resist-dissolving solvent. This method is called the removing or additive method. Emulsion masks and metal masks of the above specified type are not suitable for the transfer of patterns by means of electron, ion, and X-rays. With the increasing tendency toward microminiaturization and high integration of very small and closely packed components therefore their importance is increasingly diminishing. For economically transferring patterns by means of the above mentioned beams hole masks are more suitable where the substrate has through-holes in the form of the pattern to be transferred.

The manufacture of such hole masks where the substrate consists of a silicon wafer is described e.g. in European Patent No. 0001038. For making the hole mask, the silicon is highly doped with boron on one side so that a thin P+silicon layer is formed on the one surface. Subsequently, the silicon wafer is coated on both sides by thermal oxidation with a silicon dioxide layer. Then, a layer preferably consisting of a positive radiation-sensitive resist is applied on the oxide layer adjacent to the highly doped surface. Into this resist layer, the respective pattern is transferred by means of the focussed beam, and subsequently the radiation-sensitive resist layer is developed. Using the still remaining resist layer as an etching mask, the exposed silicon dioxide is etched off down to the silicon substrate. Then, using the silicon dioxide layer as an etching mask the bared silicon is etched off, preferably by means of reactive ion etching, down to a depth thicker than the P+silicon layer. Finally, the silicon wafer is thinned by etching from the back, i.e. from the surface opposite the highly doped surface, in the regions with pattern sections. An etchant is used, as e.g. an aqueous solution of pyrocatechol and ethylenediamine, which does not etch P+silicon so that the etching process stops automatically as soon as this layer is reached during thinning. As the holes corresponding to the mask pattern have been etched into the silicon deeper than the thickness of the P+ silicon layer, a hole mask is obtained after the thinning of the silicon wafers with through-holes corresponding to the desired pattern.

For each of the partial patterns a mask is made. If only one complementary partial pattern is associated to each partial pattern, as in the case of the hole masks, the two masks with the partial patterns are preferably made on or in a substrate adjacent to each other.

The substrate to which the pattern is to be transferred is covered with a radiation-sensitive layer. In order to align the two masks with the partial patterns to the substrate and to each other, the substrate has to have auxiliary adjustment elements, as e.g. adjustment points or a previously applied pattern. The mask with the one partial pattern is first aligned in a predetermined manner to the thus equipped substrate, the mask having a distance from the substrate in the order of 0.5 μm.

Through blanket irradiation of the mask, the one partial pattern is then transferred latently into the radiation-sensitive layer. Subsequently, the mask with the other partial pattern is aligned in a predetermined manner to the substrate, and thus also to the one partial pattern latently transferred into the radiation-sensitive layer, and subsequently blanket exposed for latently transferring the other partial pattern, too, into the radiation-sensitive layer. There follows the development where the pattern, i.e. the sum of both partial patterns is generated in the radiation-sensitive layer (provided the radiation-sensitive layer consists of a positive resist). Under the condition that the admissible tolerances have not been exceeded in aligning the masks, the pattern in the radiation-sensitive layer shows neither undesired interruptions, as according to prior art particularly in the transfer with ion beams, nor bloomings which can be encountered as a consequence of double exposure in excessively large areas in connection with ultraviolet light or electron beams owing to the scattering effects connected with this kind of radiation. The pattern generated in the radiation-sensitive layer is transferred into the substrate in that, using the radiation-sensitive layer as a mask the substrate regions not covered by the mask are etched off down to a predetermined depth. In this manner it is possible to make windows, e.g. in an oxide layer on a semiconductor wafer, for contacting and selectively introducing doping impurities into the semiconductor material, or to produce a conductor pattern of a metal layer applied on a semiconductor wafer. In the latter case—provided the radiation-sensitive layer consists of a positive resist—the etched metallic layer represents the negative of the originally designed pattern. A conductor pattern which corresponds to the originally designed pattern can be made on a substrate if after the developing of the radiation-sensitive layer a metal layer is blanket evaporated, and subsequently, using a solvent dissolving the radiation-sensitive layer said layer and the metal provided thereon are removed.

According to the above descriptions, the method as disclosed by the invention can be used with particular advantage for making complementary hole masks. The partitioning of the pattern into two partial patterns, and the generation of regions in the two partial patterns which overlap when the two partial patterns are projected onto a substrate, by means of negative and positive windage of the pattern or of the partial patterns, respectively, is preferably implemented under program control. The masks which are made in accordance with the method as disclosed by the invention and which contain the two partial patterns are entirely similar with respect to their mechanical stability and their thermal properties, and they ensure a high pattern fidelity transfer onto the substrate, and the absence of undesired interruptions and bloomings in the transferred pattern.

The above specifications concerning the method as disclosed by the invention did not consider a source of errors in pattern transfer which can become important if the transfer is to be executed with extreme fidelity. A radiation-sensitive layer is developed after irradiation, e.g. upon mask production, by means of a wet process. In this process, manufacturing tolerances are inevitable which affect the precision of the pattern transfer. If hole masks are made following the method as disclosed by the invention this source of errors can be eliminated. This embodiment of the method as disclosed by the invention which will be discussed with reference to FIGS. 7 and 8 is based on the knowledge that if material is applied on the surface of hole masks, either by cathode sputtering or through obliquely directed evaporation onto the mask rotating round an axis perpendicularly to its surface, defined quantities of the material also grow on the hole walls so that the dimension of the holes is reduced. The embodiment of the method as disclosed by the invention is implemented as follows: the elements of the partial patterns have dimensions greater than corresponding to the nominal value. The dimensional increase is determined in such a manner that the holes in the mask substrate that have been made on the basis of the partial pattern with the enlarged elements are either precisely equal to the respective nominal value, even with the maximum manufacturing tolerances, or bigger than it would correspond thereto. The elements in the partial pattern are enlarged specifically either by considering such enlargement in the designed stage already or, while starting from the desired pattern, by predetermining the amounts of the corresponding positive and negative windage and thus achieving the desired enlargement. When the holes have been made their dimensions are measured, e.g. by means of an electron beam raster microscope with a precision better than 0.1 μm. If it is found that the holes have the nominal size no further operation is required; the mask is complete. If the holes are bigger than the nominal value material has to be applied to reduce their size. Many materials are suitable for reducing the hole size, but gold is preferably used. As mentioned above the material, e.g. gold, can be applied either by obliquely directed evaporation onto the mask surface which rotates round an axis perpendicularly to its surface, or by cathode sputtering. If the cathode sputtering process uses a large target, e.g. of gold, the gold particles impinging on the mask have a wide angular distribution. According to FIGS. 7 and 8 depicting a section of hole mask 21 in a cross-section in parallel (FIG. 7), and vertically (FIG. 8) to the mask surface, material 23, e.g. gold, is deposited not only on the mask surface but also on walls 22 of the mask holes. As shown in FIG. 8, more material 23 is usually grown on the mask surface than on hole walls 22. The thickness ratio of the material grown on the mask surface and on hole walls 22 depends on the angular distribution of the impinging particles. In an experiment made by the inventors, a gold layer of 0.85 μm thickness was applied on the mask surface by means of cathode sputtering, and on hole walls 22 a gold layer of 0.31 μm thickness. Corresponding results are achieved if material 23 is applied on the rotating mask by means of obliquely directed evaporation, the thickness ratio of the material deposited on the mask surface and hole walls 22 depending on the angle between the steam jet and the mask surface. Surprisingly, the material can be grown highly reproducibly both by means of cathode sputtering and by means of evaporation on the hole walls so that holes 24 can be made in the mask with precisely the predetermined nominal size. The described embodiment of the method as disclosed by the invention is applicable with particular advantage if, as usual with hole masks, these masks with the two partial patterns are on one and the same substrate. Since the entire substrate, in wet development as well as in the application of the material is exposed to exactly the same conditions both masks show the same defect after the holes have been made, and if both masks are then exposed to the same cathode sputtering or evaporation process the desired nominal size of the holes is achieved in both masks, at the same time. In this manner, the described embodiment of the method as disclosed by the invention is particularly uncomplicated. The applying of gold has the additional advantage that it increases the heat conductivity of the masks so that the mask is not strongly heated during irradiation, which means that the distortion of the mask pattern caused by mask heating is reduced. As described above in connection with the non-corrected hole masks, the hole masks improved by means of the described embodiment will then be used to transfer the pattern to the substrate.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. Method of transferring a pattern to a radiation-sensitive layer on substrates, where two partial masking patterns which, when superimposed upon each other in a predetermined alignment, yield the complete pattern, with elements of both partial patterns combining to form elements of the complete pattern and these partial pattern elements overlapping sectionally, aligned relative to each other and to the substrate in the predetermined manner, are projected with a suitable radiation to the radiation-sensitive layer, with the complete pattern being latently formed in the radiation-sensitive layer, and where the radiation-sensitive layer is then developed, characterized in that designing of the two partial masking patterns comprises
   producing a complete pattern of elements of the desired pattern to be transferred,
   producing a reduced size image of the complete pattern by exposure of the complete pattern to negative windage to thereby reduce the size of the elements of the pattern by a predetermined amount,
   partitioning the resultant complete pattern reduced in size by negative windage into two negative windage partial patterns,
   producing two expanded partial masking patterns by exposing the partial patterns to positive windage to thereby increase the size of the elements in the partial patterns by a predetermined amount to compensate for the amount reduced by negative windage;
   said expanded partial patterns collectively used for exposing a radiation sensitive layer to define said desired pattern.

2. Method as claimed in claim 1, characterized in that designing is based on a pattern identical with the pattern to be transferred, and that positive and negative windage is implemented to the same amounts.

3. Method as claimed in claim 2, characterized in that the overlap areas of the projections of the combinatory partial pattern elements, with optimum alignment, do not exceed 0.2 μm perpendicularly to the line which with flush fitting of complementary partial pattern elements, would represent the demarcation between the two partial pattern elements.

4. Method as claimed in claim 1, characterized in that two masks whose pattern is identical with one respective of the partial patterns are used in the transfer.

5. Method as claimed in claim 1, characterized in that the negative and positive windage and partitioning are implemented by drawing means.

6. Method as claimed in claim 1, characterized in that the negative and positive windage and partitioning are implemented under program control.

7. Method as claimed in claim 6, characterized in that the desired pattern is serially designed under program control on a screen connected to a computer, and stored in machine readable form in the storage of the computer, that the stored pattern is exposed to a negative windage under program control, partitioned into negative windage partial patterns, and that the negative windage partial patterns are then exposed to a positive windage to the desired size, that the thus obtained stored partial patterns are then converted in a post processor into instructions for controlling an electron beam, with the two partial patterns being latently transferred respectively into a radiation-sensitive layer applied on the mask substrate, with the radiation-sensitive layers being developed, the partial patterns in the radiation-sensitive layers being transferred into the mask substrate, with the partial patterns being subsequently precisely aligned relative to each other in two successive irradiation steps using the masks, and transferred into a radiation-sensitive layer covering a substrate, and with the layer being subsequently developed.

8. Method as claimed in claim 4, characterized in that the two masks are designed in the form of a hole mask where both partial patterns are arranged adjacent to each other, and where the elements of the partial patterns are through-holes.

9. Method as claimed in claim 7, characterized in that when designing the pattern the partial pattern elements later to be inserted into the mask as holes are dimensioned in such a manner that they are bigger than designed by the maximum manufacturing tolerance of the production of the holes, and that after the holes have been made the actual deviation of their dimensions from the nominal value is determined, and that finally by applying material on the hole walls the desired hole size is achieved.

10. Method as claimed in claim 9, characterized in that the material is applied by oblique application on the mask surface rotating round an axis vertically to the mask surface.

11. Method as claimed in claim 10, characterized in that said material is gold.

* * * * *